United States Patent [19]

Hashemi et al.

[11] Patent Number: 5,550,065
[45] Date of Patent: Aug. 27, 1996

[54] METHOD OF FABRICATING SELF-ALIGNED FET STRUCTURE HAVING A HIGH TEMPERATURE STABLE T-SHAPED SCHOTTKY GATE CONTACT

[75] Inventors: Majid M. Hashemi, Tempe; Saied N. Tehrani, Scottsdale; Patricia A. Norton, Mesa, all of Ariz.

[73] Assignee: Motorola, Schaumburg, Ill.

[21] Appl. No.: 344,911

[22] Filed: Nov. 25, 1994

[51] Int. Cl.⁶ .................................................. H01L 21/265
[52] U.S. Cl. ........................... 437/39; 437/41; 437/192; 437/912; 437/944; 148/DIG. 3; 148/DIG. 100; 148/DIG. 131; 148/DIG. 140; 257/283; 257/486
[58] Field of Search ........................... 437/912, 39, 41, 437/192, 944; 148/DIG. 3, DIG. 100, DIG. 131, DIG. 140; 257/260, 281, 471, 283, 486

[56] References Cited

U.S. PATENT DOCUMENTS

| | | | |
|---|---|---|---|
| 4,679,311 | 7/1987 | Lakhani et al. | 257/283 |
| 4,712,219 | 12/1987 | Yano et al. | 372/45 |
| 4,735,913 | 4/1988 | Hayes | 437/912 |
| 4,782,032 | 11/1988 | Geissberger et al. | 437/41 |
| 4,845,534 | 7/1989 | Fukuta | 257/283 |
| 4,849,376 | 7/1989 | Balzan et al. . | |
| 4,977,100 | 12/1990 | Shimura | 257/283 |
| 5,225,360 | 7/1993 | Shim et al. | 437/912 |
| 5,245,207 | 7/1993 | Mikoshiba et al. | 257/392 |
| 5,332,627 | 7/1994 | Watanabe et al. | 428/426 |
| 5,381,027 | 1/1995 | Usagawa et al. | 257/192 |

FOREIGN PATENT DOCUMENTS

| | | |
|---|---|---|
| 1137317 | 6/1986 | Japan . |
| 363213371 | 9/1988 | Japan ................. 257/283 |
| 2234442 | 9/1990 | Japan . |

Primary Examiner—George Fourson
Assistant Examiner—Long Pham
Attorney, Agent, or Firm—Eugene A. Parsons

[57] ABSTRACT

A method of fabricating a self-aligned FET having a semi-insulating substrate of GaAs or InP with a conductive channel formed either by doping the surface or an epitaxially grown channel by molecular beam epitaxy or metalorganic vapor phase epitaxy in the substrate adjacent the surface. Forming a high temperature stable $LaB_6$/TiWN "T-shaped" Schottky gate contact on the substrate surface, which is used for source and drain ohmic region implants into the substrate adjacent to the surface and self-aligned to the "T-shaped" gate, with source and drain ohmic contacts also self-aligned with respect to the gate.

1 Claim, 2 Drawing Sheets

METHOD OF FABRICATING SELF-ALIGNED FET STRUCTURE HAVING A HIGH TEMPERATURE STABLE T-SHAPED SCHOTTKY GATE CONTACT

FIELD OF THE INVENTION

The present invention pertains to field effect transistors (FETs) and more specifically to self-aligned FET structure.

BACKGROUND OF THE INVENTION

Self-aligned GaAs FETs are widely used in high speed integrated circuits to minimize the gate-source and gate-drain parasitic resistances. Most self-aligned processes use a refractory gate metal (i.e. TiW) as a mask for self-aligned implantation of n+ source and drain ohmic regions. Refractory metals are used for their high temperature electrical, metallurgical stability during the post implant high temperature annealing of about 800°–850° C. This self-aligned n+ source and drain implant reduces the parasitic source and drain resistances, however in order to substantially reduce these parasitic resistances it is necessary to reduce the distance between source and drain ohmic contacts by developing a manufacturable process that allows for self-aligned deposition of source and drain metal contacts.

It is also important to be table to control the distance between gate metal and n+ source and drain implant regions, since they play an important role in both speed (through gate-source capacitance Cgs) and power (breakdown voltage VBgd) performance of a FET. A prior art patent, U.S. Pat. No. 4,782,032, issued to Geissberger et al on Nov. 1, 1988, addresses the control of n+ source and drain implants to the gate metal by using a "mushroom" or "T-shaped" gate process. This process requires the deposition of another layer either a dielectric or metal on top of the refractory metal and acts as the mask for subsequent etching and undercutting (in a controllable fashion) of the underlying refractory gate. The etching process is done either by wet chemical etch or dry etching. The sacrificial top layer is then removed prior to high temperature annealing of the n+ source and drain implants due to lack of high temperature stability of the top layer. Removing the top layer eliminates the choice of fabricating the ohmic metal contacts in a self-aligned manner with respect to the gate metal.

In another prior art patent, U.S. Pat. No. 4,712,219, issued to McLevige on Dec. 15, 1987, a high temperature stable material using a doped silicon layer is suggested that requires a complicated process of selectively etching and doping of a silicon layer, which is not a manufacturable process. There is no prior art that combines the "mushroom" or "T-shaped" gate process using a stable top layer for both self-align n+ source and drain implant, and ohmic contacts that is easily manufacturable.

It would be desirable, therefore, to devise a method of fabricating self-aligned FETs which is easily manufacturable.

It is a purpose of the present invention to provide a method of fabricating self-aligned FETs with both n+ implants and ohmic metals formed in a self-aligned fashion with respect to the gate which is easily manufacturable.

It is a further purpose of the present invention to provide a method of fabricating self-aligned FETs with controllable distances between gate metal and n+ source and drain implants.

It is a still further purpose of the present invention to provide a method of fabricating self-aligned FETs which eliminates any critical alignment of source and drain ohmic contacts.

It is a still further purpose of the present invention to provide a method of fabricating self-aligned FETs with improved speed performance for use in digital circuitry.

It is a still further purpose of the present invention to provide a method of fabricating self-aligned FETs which eliminates any critical processing steps for reducing gate resistance.

SUMMARY OF THE INVENTION

The present invention provides a method of fabricating a self-aligned FET on a surface of a semiconductor substrate using LaB6/TiWN as a "T-shape" gate structure formed by a controllable dry etching of the TiWN using LaB6 as the mask which allows control of n+ implant distance to gate edge. The high temperature stability of the $LaB_6$/TiWN structure allows the "T-shaped" gate to be preserved during the high temperature post n+ source and drain implant annealing step and subsequently to be used for the self-aligned formation of source and drain ohmic contact metals on the surface of the substrate and in spaced relationship while simultaneously depositing extra low resistance metal over the "T-shaped" gate metal, producing low gate resistance without extra complicated processes.

BRIEF DESCRIPTION OF THE DRAWINGS

Referring to the drawings.

DESCRIPTION OF THE PREFERRED EMBODIMENT

Figure 1:
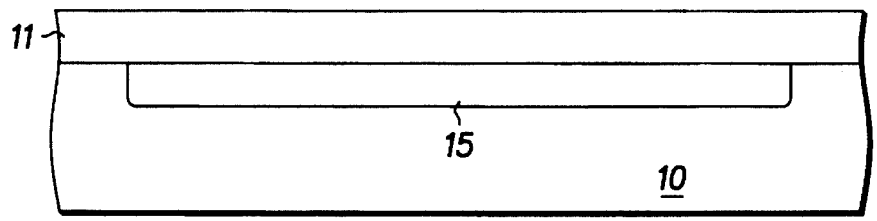
FIGS. 1 through 9 illustrate, in simplified cross-sectional views, a series of intermediate steps and a final step in the fabrication of a self-aligned FET structure using a LaB6/TiWN "T-shape" gate in accordance with the present invention.

FIG. 1 shows a simplified cross-sectional view of an intermediate step in the fabrication of a self-aligned FET structure using a $LaB_6$/TiWN "T-shape" gate in accordance with the present invention. FIG. 1 includes semiconductor substrate GaAs 10, or other semiconductor substrates such as indium phosphide or silicon, with an implanted channel 15 followed by sputter deposition of TiWN refractory gate metal layer 11. TiWN is used for its high temperature stability. Channel 15 could also be epitaxially grown by either molecular beam epitaxy or metal organic chemical vapor epitaxy.

Figure 2:
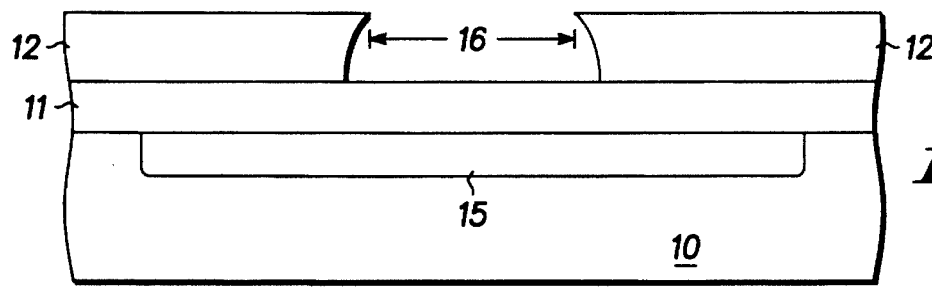
Figure 3:
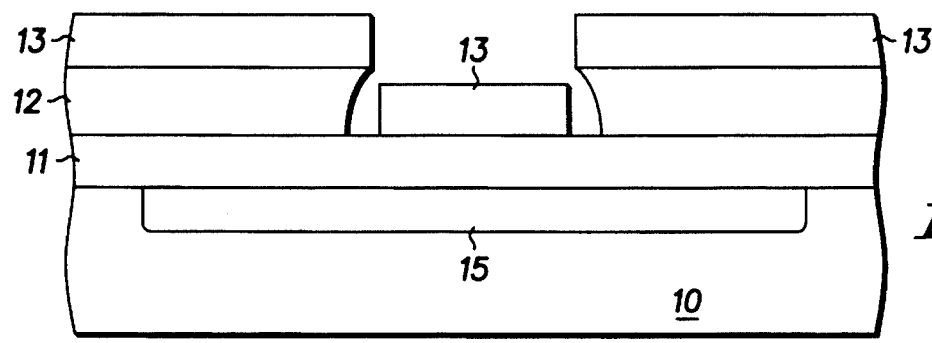

Referring specifically to FIG. 2, a photoresist layer 12 is deposited on the surface of layer 11 so as to specifically overlie implanted channel 15. An opening 16 is formed in layer 12 by any standard photolithography process. FIG. 3 illustrates the selective deposition of a $LaB_6$ layer 13 on the surface of layer 11 in opening 16 through the lift-off process. Layer 13 of $LaB_6$ is deposited by electron beam evaporation which eliminates any subsequent patterning and selective etch development.

Figure 4:
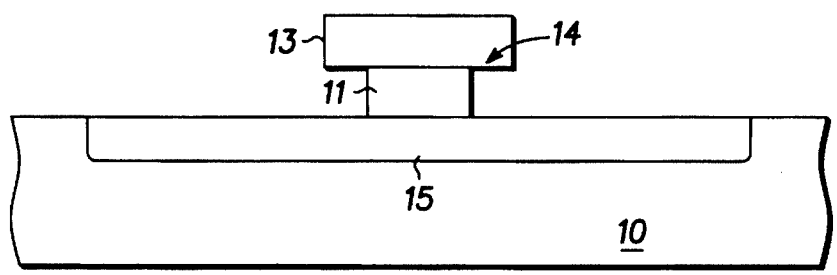
Figure 5:
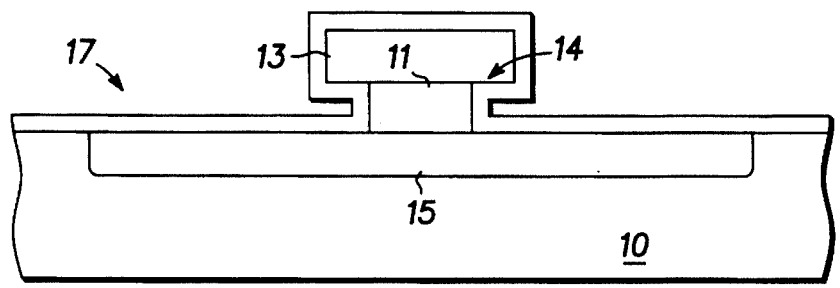

FIG. 4 shows the cross section of $LaB_6$/TiWN "T-shape" gate structure. The "T-shaped" gate structure is formed by removing photoresist layer 12 and selective dry etching of TiWN layer 11 using LaB6 layer 13 as the mask. The selective dry etching uses SF6 (20 SCCM), CHF3 (13 SCCM), He (40 SCCM) at plasma frequency of 13.56 MHz with RF power and pressure of 145 W and 130 m Torr respectively. The etch rate of this process is around 500 Å/min and due to extremely high selectivity of this etch (greater than 200:1) during the etching of TiWN layer 11 neither LaB$_6$ layer 13 nor channel layer 15 is etched. The etch rate of TiWN is slow enough to allow the reproducible control of undercut 14. FIG. 5 shows the cross section of a silicon nitride layer 17 passivated LaB$_6$/TiWN "T-shaped" gate structure. After the etching step of FIG. 4, the entire structure is passivated by forming layer 17 thereover.

Figure 6:
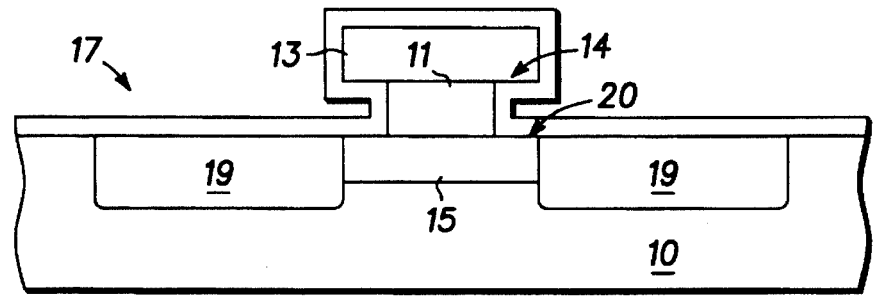

Source and drain ohmic regions 19 are implanted in a self-aligned fashion using the "T-shaped" gate as the mask, as shown in FIG. 6. The structure is subsequently annealed at 750° C. for 10 second. Since LaB$_6$ layer 13 is both a metal and can withstand high temperature processes it does not have to be removed before deposition of source drain metal in a self-aligned fashion. The distance of undercut 14 determines the distance 20 between gate metal 11 and n+ source and drain implant regions 19 which influence the speed (through affecting the gate-source capacitance) and power performance (through affecting the breakdown voltage) of a FET device.

Most prior art used a "T-shape" gate structure with a top layer 13 such as nickel, silicon dioxide, or silicon nitride. The problem with these top layers are that the silicon dioxide, or silicon nitride are dielectric layers which can withstand high temperature process, however they eliminate the option of a self-aligned formation of source drain ohmic contacts using the "T-shaped" gate as the mask since they have to be removed prior to source anti drain metallization. If the silicon dioxide or silicon nitride layers are not removed, a dielectric layer is left between gate metal layer 11 and the subsequently deposited contacts. On the other hand metallic layers such as nickel are not compatible with the high temperature (greater than 750° C.) annealing process required for activation of n+ source and drain implant regions 19 and therefore have to be removed or etched at this step of the processing.

In the prior art patent (U.S. Pat. No. 4,712,219) described above, a high temperature stable conductive material using a doped silicon layer was suggested that requires a complicated process of selectively etching and doping of a silicon layer which is not a manufacturable process. However in the present invention we propose LaB6 layer 13 which is a refractory metal and has excellent mechanical, metallurgical, and electrical stability (was verified by secondary ion mass spectroscopy SIMS and scanning electron microscope SEM analysis) during high temperature processes when sandwiched between silicon nitride 17 and TiWN 11.

The advantages of LaB6 over other refractory metals is that it is easily evaporated using electron beam evaporation and patterned using conventional lift-off process therefore eliminating difficult dry etching processes needed for other refractory metal such as molybdenum. Also since LaB$_6$ is difficult to etch it acts as a perfect mask for selective etching of TiWN underlying gate layer 11 for its patterning and formation of the "T-shaped" gate.

Figure 7:
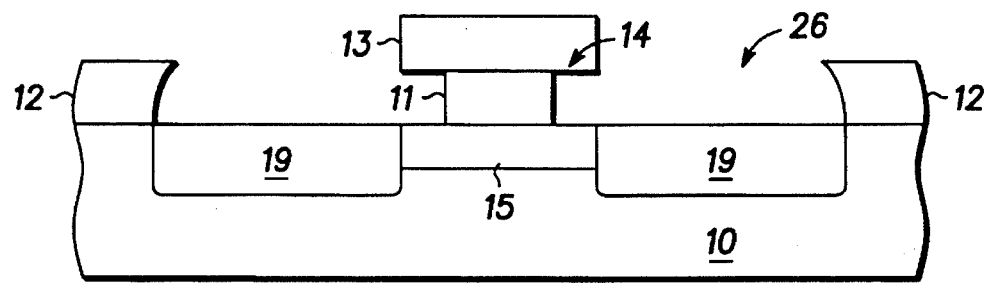
Figure 8:
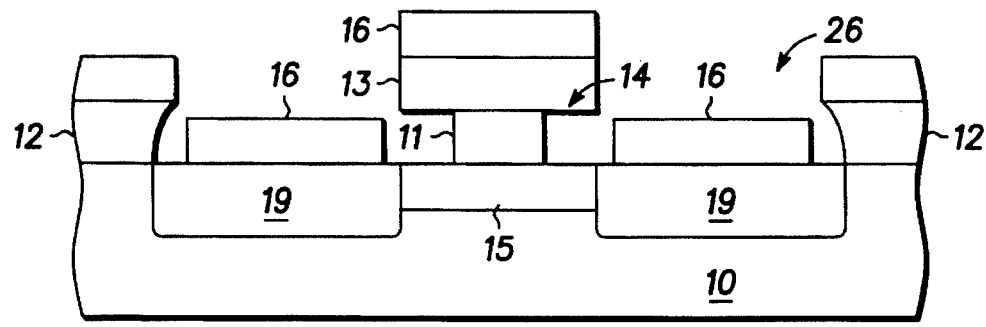

Referring specifically to FIG. 7, a photoresist layer 12 is deposited on the surface of substrate 10 so as to specifically overlie the entire structure. An opening 26 is formed in layer 12 using standard photolithography process as illustrated in FIG. 7. FIG. 8 illustrates the selective deposition of a layer 16 of Ge/Ni/Au in a self-aligned manner on the surfaces of layer 13 and layer 19 and in the opening 26 through the lift-off process that eliminates any need for precise registration and aligning of the source and drain contacts. This self-align ohmic contact process not only minimizes the parasitic resistance it also reduces the gate resistance simultaneously by depositing layer 16 on top of layer 13 in the "T-shape" gate. This is extremely important since most refractory metals have very high resistance which severely degrade the gain, noise figure, frequency response, and efficiency of the transistor.

Figure 9:
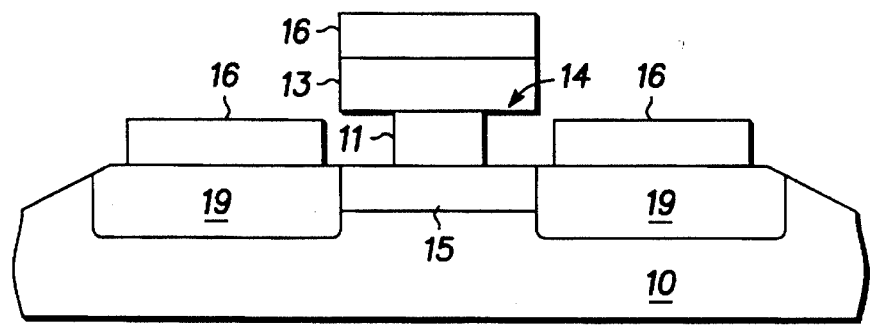

FIG. 9 shows the final step of the fabrication process which is device isolation formation. The device formed as described above, is isolated from other devices on substrate 10 by mesa etch (see FIG. 9) or by ion implantation. In ion implantation a guard ring is implanted around the device for isolation in a well known manner.

The present invention provides a method of fabricating self-aligned FET with both n+ implants and ohmic metals formed in a self-aligned fashion with respect to the gate which is easily manufacturable with controllable distances between gate metal and n+ source and drain implants which eliminates any critical alignment of source and drain ohmic contacts. The present invention still further provides a method of fabricating self-aligned FETs with improved speed performance for use in digital circuitry which eliminates any critical processing steps for reducing gate resistance.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a self-aligned FET comprising the steps of:

providing a substrate having a surface:

forming a conductive channel in the substrate adjacent the surface;

depositing a layer of TiWN refractory gate metal on the surface of the substrate to form a Schottky gate contact on the substrate;

selectively depositing a layer of LaB$_6$ on the layer of TiWN by electron beam deposition and photolithography;

selectively dry etching the layer of TiWN, using the layer of LaB$_6$ as a mask, to form a high temperature stable "T-shaped" Schottky gate contact on the surface of the substrate in overlying relationship to the conductive channel;

implanting a dopant into the substrate to form source and drain regions in overlying relationship to the conductive channel adjacent the surface in spaced relationship to the "T-shaped" gate and in spaced apart relationship using the "T-shaped" Schottky gate contact as a mask;

annealing the implanted source and drain regions; and selectively depositing metal to form source and drain ohmic contacts on the surface of the substrate in overlying relationship to the source and drain ohmic regions using the "T-shaped" Schottky gate contact as a mask.

* * * * *